US008025507B2

(12) United States Patent
Kim et al.

(10) Patent No.: US 8,025,507 B2
(45) Date of Patent: Sep. 27, 2011

(54) CONNECTOR

(75) Inventors: Ju Rae Kim, Gyeonggi-do (KR); Jong Rak Kim, Gyeonggi-do (KR); Min Jin Kim, Gyeonggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 191 days.

(21) Appl. No.: 12/473,643

(22) Filed: May 28, 2009

(65) Prior Publication Data

US 2010/0255694 A1 Oct. 7, 2010

(30) Foreign Application Priority Data

Apr. 2, 2009 (KR) ........................ 10-2009-0028369

(51) Int. Cl.
*H01R 12/00* (2006.01)
*H05K 1/00* (2006.01)

(52) U.S. Cl. ............................. 439/79; 439/65; 439/567

(58) Field of Classification Search .................... 439/79, 439/65, 78, 680, 567, 64
See application file for complete search history.

(56) References Cited

U.S. PATENT DOCUMENTS

| | | | | |
|---|---|---|---|---|
| 5,035,641 | A * | 7/1991 | Van-Santbrink et al. | 439/329 |
| 6,764,344 | B2 * | 7/2004 | Maiers | 439/629 |
| 7,462,036 | B2 * | 12/2008 | Shin et al. | 439/65 |

FOREIGN PATENT DOCUMENTS

KR 10-818510 B1 3/2008

* cited by examiner

*Primary Examiner* — Javaid Nasri
(74) *Attorney, Agent, or Firm* — McDermott Will & Emery LLP

(57) ABSTRACT

The present invention provides a connector including: a printed circuit board including a guide hole and a locking hole; a plurality of connection pads provided on a top surface of the printed circuit board; a housing which is mounted on the printed circuit board and including a guide inserted into the guide hole and a locking unit inserted into the locking hole, which are protrudingly formed on a bottom surface of the housing; a plurality of terminals inserted and fixed into the housing so that one ends are positioned inside the housing and the other ends are projected to an outside of the housing; and terminal units in contact with top surfaces of the connection pads by being connected to the one ends of the terminals inside the housing.

19 Claims, 7 Drawing Sheets

[FIG. 1]
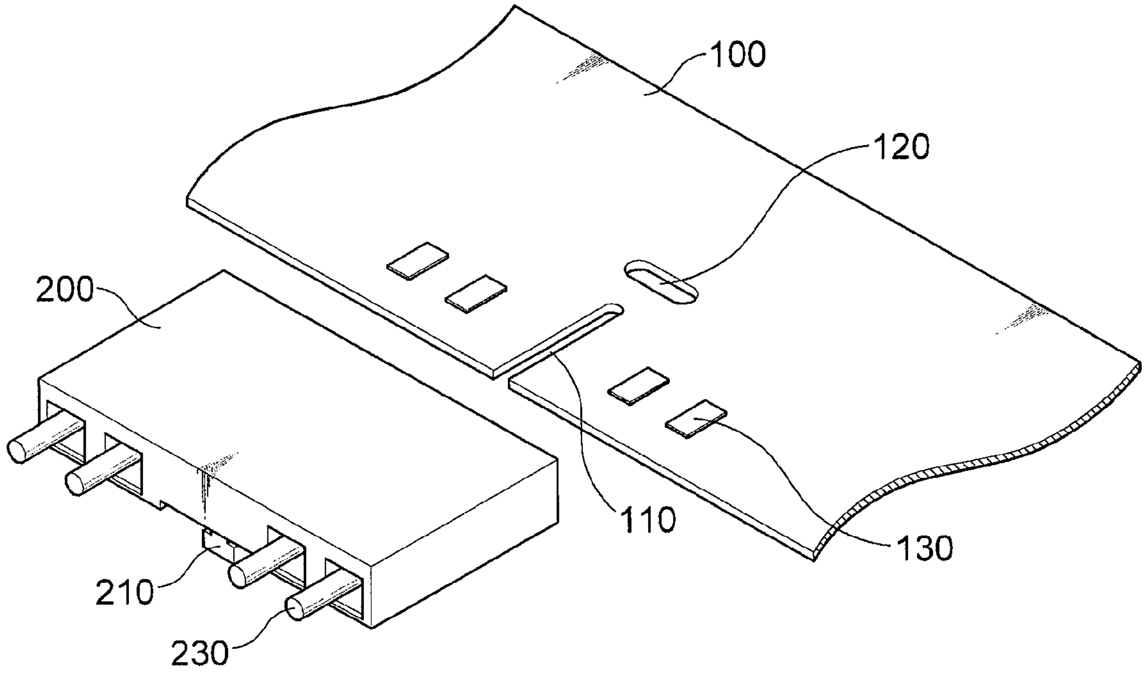
[FIG. 2]
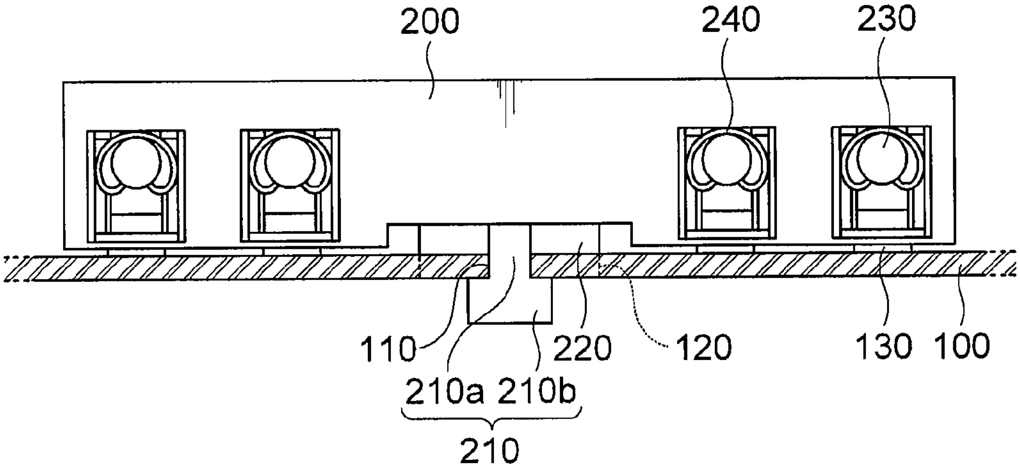

[FIG. 3]
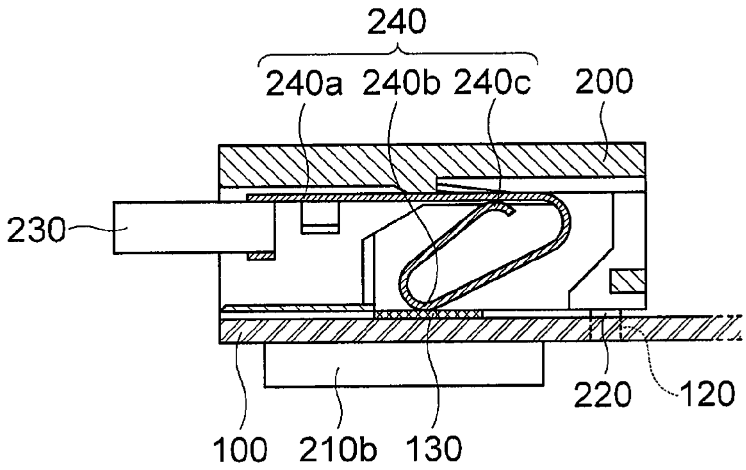
[FIG. 4]
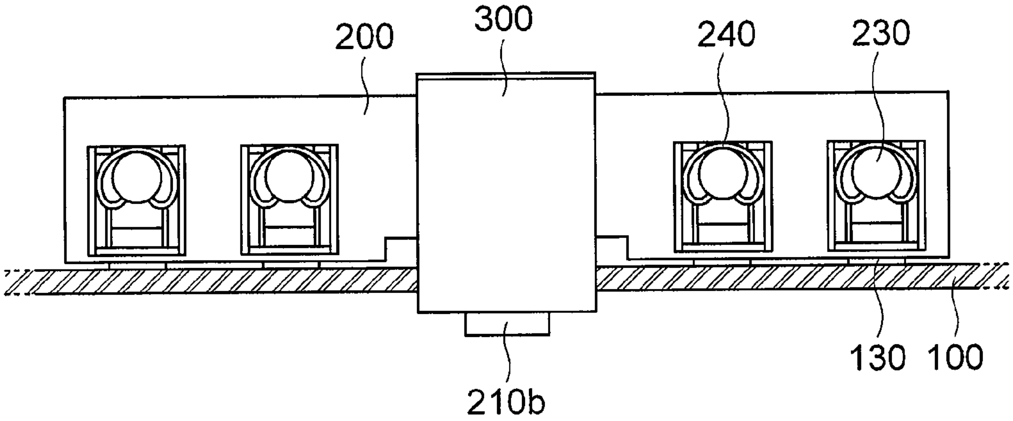
[FIG. 5]
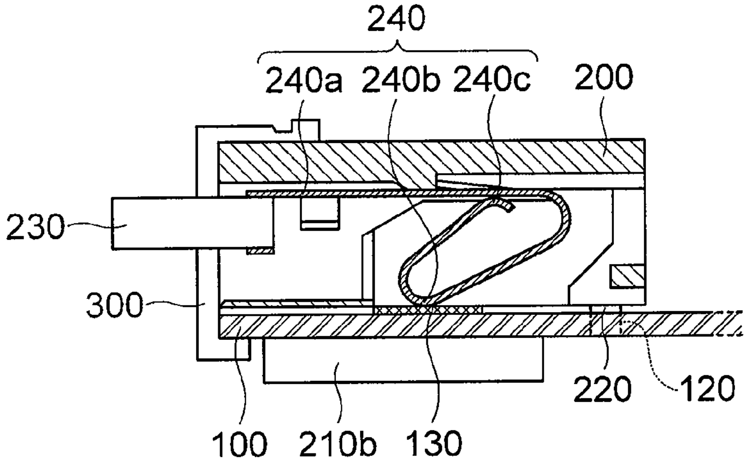

[FIG. 6]
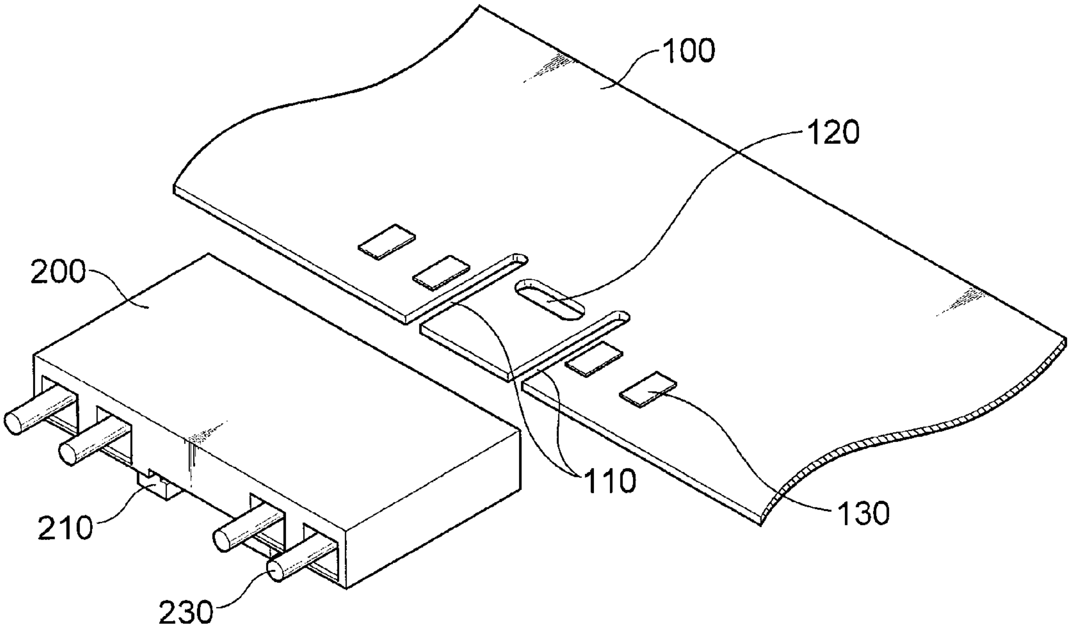
[FIG. 7]
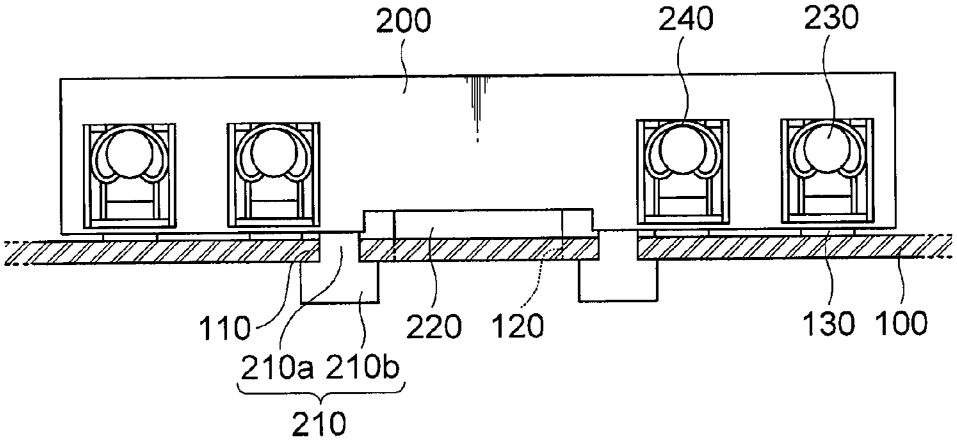

[FIG. 8]
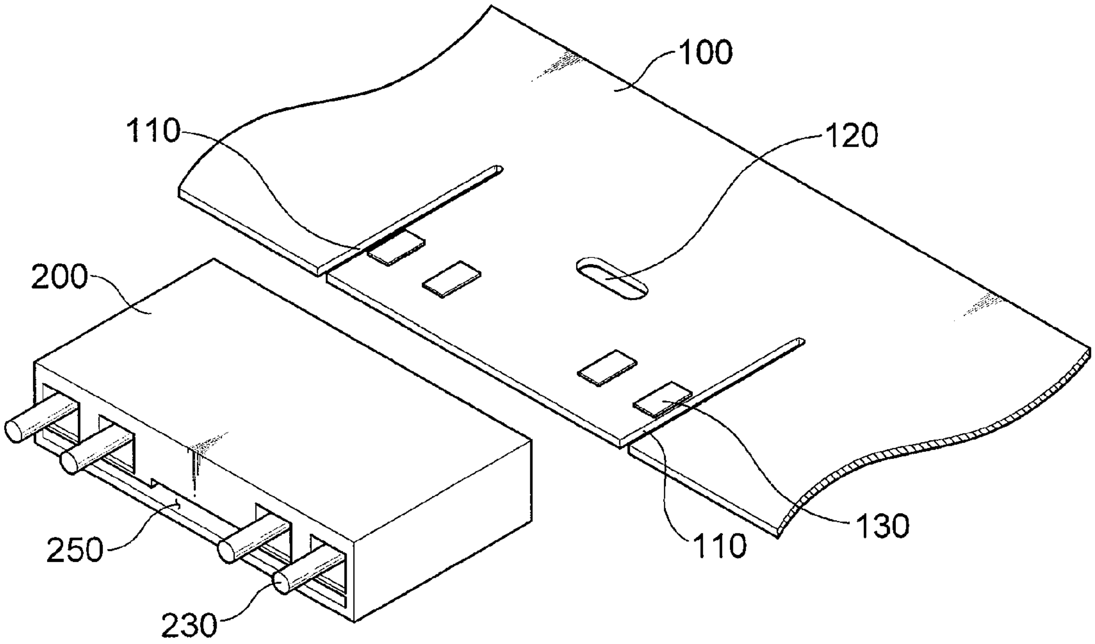
[FIG. 9]
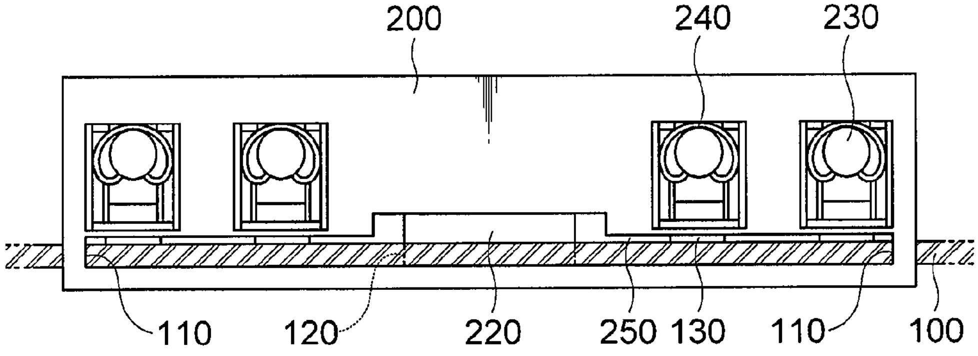

[FIG. 10]
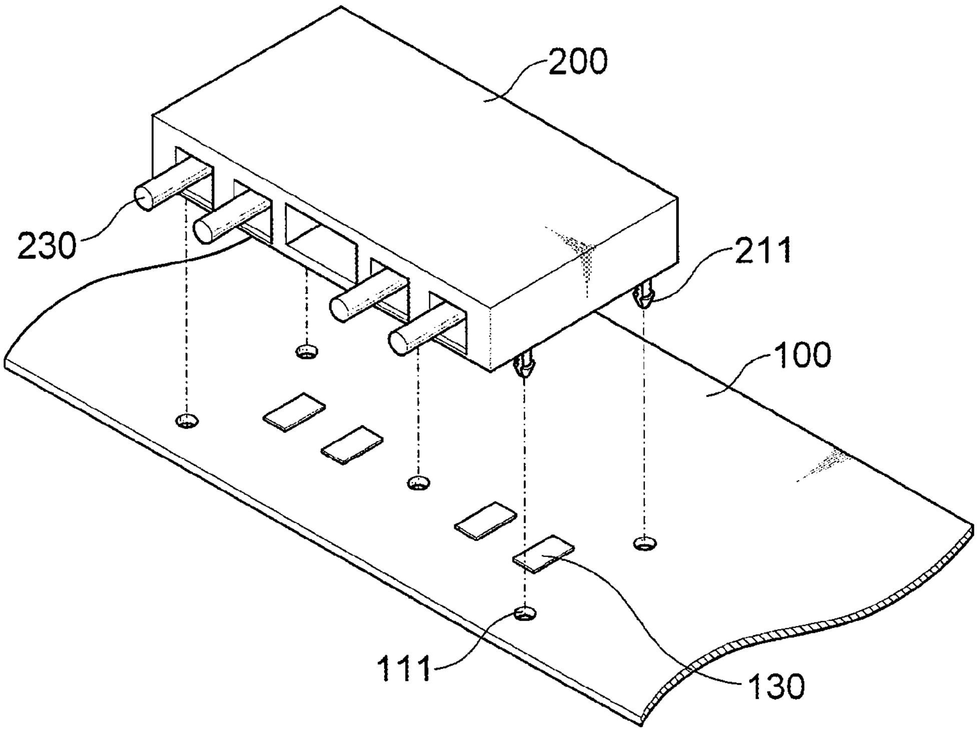
[FIG. 11]
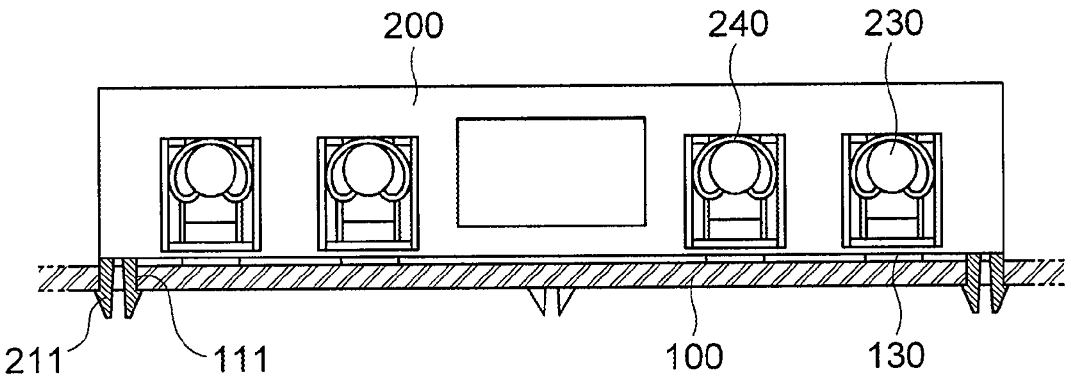

[FIG. 12]
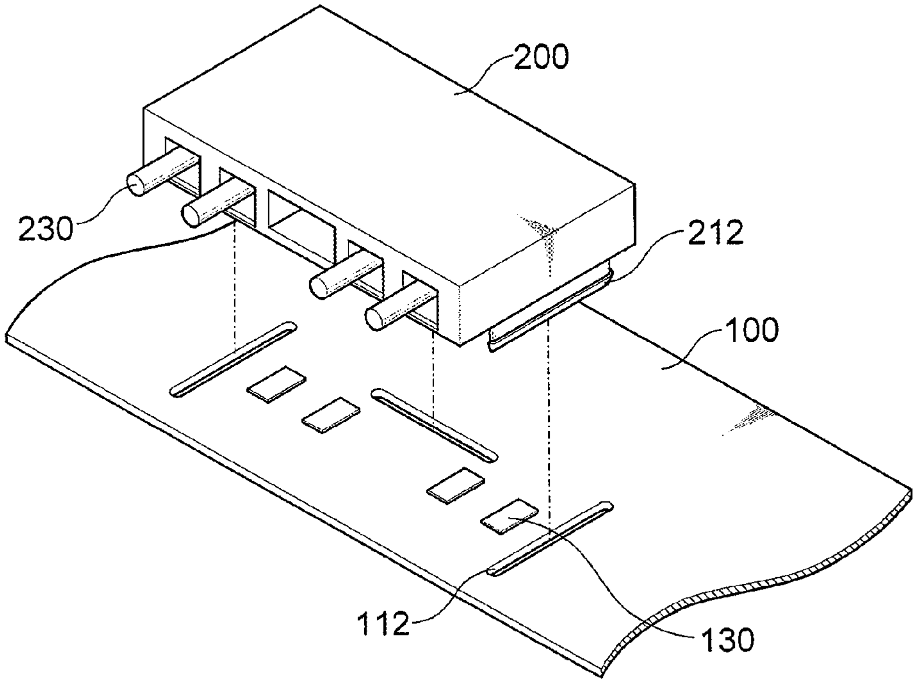
[FIG. 13]
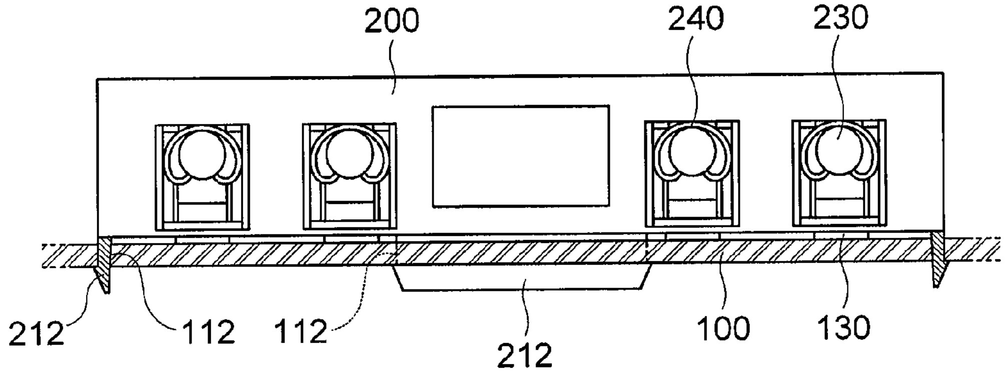

[FIG. 14]
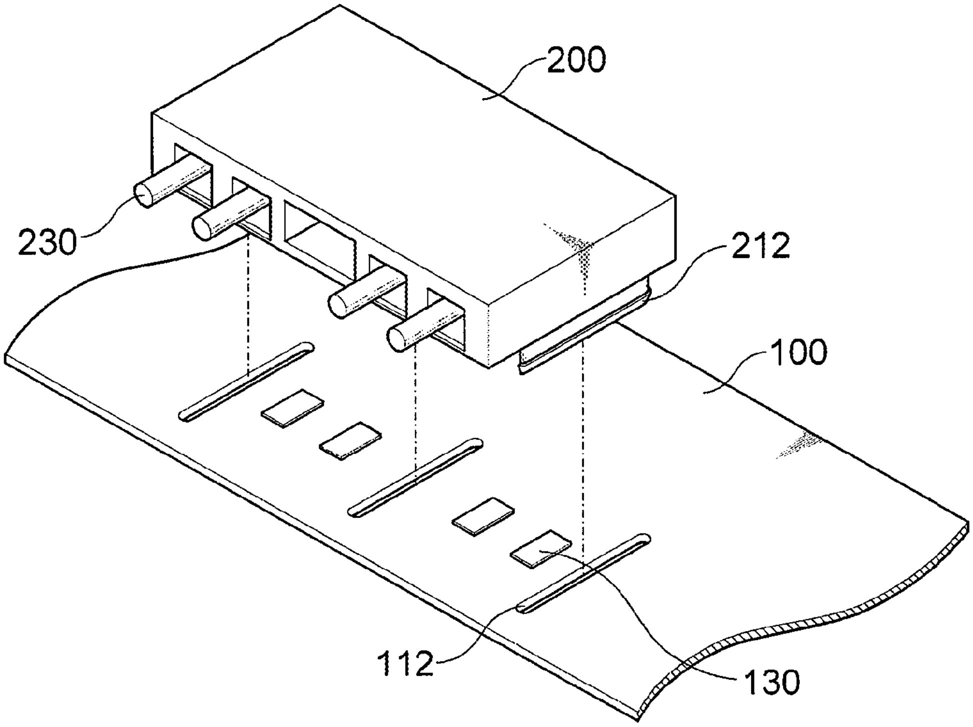
[FIG. 15]
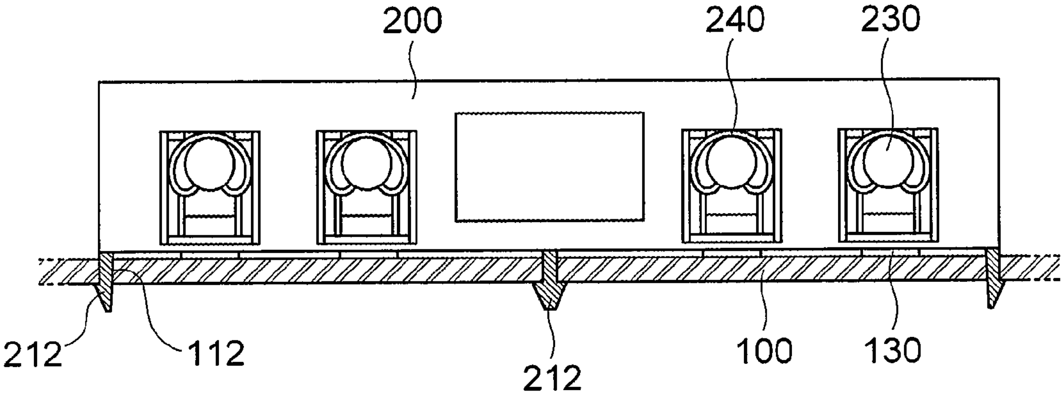

CONNECTOR

CROSS-REFERENCE TO RELATED APPLICATIONS

This application claims the benefit of Korean Patent Application No. 10-2009-0028369 filed with the Korea Intellectual Property Office on Apr. 2, 2009, the disclosure of which is incorporated herein by reference.

BACKGROUND OF THE INVENTION

1. Field of the Invention

The present invention relates to a connector; and, more particularly, to a connector including a printed circuit board provided with a guide hole and a locking hole for mechanical coupling with a housing and provided with connection pads in contact with terminal units connected to terminals of the housing on a top surface.

2. Description of the Related Art

With development of display technology, an LCD(Liquid Crystal Display) is being increasingly widely used in a TV and a monitor. Compared to a CRT(Cathode-Ray Tube) monitor, the LCD has advantages in that a longitudinal cross-section is slimmed and flicker is reduced.

A CLCD(Color Liquid Crystal Display) TV consists of an SMPS(Switching Mode Power Supply) part for receiving use power(AC) and converting it into a DC voltage for a load, an inverter unit for driving a CCFL(Cold Cathode Fluorescent Lamp) by using output of the SMPS as power, and a control board for performing the other functions. And a connector is used to connect the power.

A conventional connector includes a wafer which is mounted on a printed circuit board and includes a terminal unit inside, and a housing which is mounted on an upper part of the wafer and includes a terminal which is inserted and fixed to be electrically connected to the terminal unit inside the wafer.

However, as an LCD TV is generally used, it is needed to secure price competition for a product and therefore cost reduction is required by reducing the number of parts of the product.

SUMMARY OF THE INVENTION

The present invention has been proposed in order to overcome the above-described problems and it is, therefore, an object of the present invention to provide a connector capable of reducing a manufacture cost by reducing the number of parts.

In accordance with one aspect of the present invention to achieve the object, there is provided a connector including: a printed circuit board including a guide hole and a locking hole; a plurality of connection pads provided on a top surface of the printed circuit board; a housing which is mounted on the printed circuit board and includes a guide inserted into the guide hole and a locking unit inserted into the locking hole, which are protrudingly formed on a bottom surface of the housing; a plurality of terminals inserted and fixed into the housing so that one ends are positioned inside the housing and the other ends are projected to an outside of the housing; and terminal units in contact with top surfaces of the connection pads by being connected to the one ends of the terminals inside the housing.

Herein, the guide hole is extended from an edge to an inside of the printed circuit board.

Further, the guide hole is formed in a linear shape.

Further, the locking hole is spaced apart from the guide hole.

Further, the guide includes an insertion unit inserted into the guide hole and a fixing unit not inserted into the guide hole by being extended at a lower part of the insertion unit to include a larger width than the insertion unit.

Further, the locking unit is formed of elastic material.

Further, each of the terminal units includes an extension unit extended into the housing by being coupled with the terminal and an elastic unit which is extended from the extension unit and bent toward the terminal downward with elastic force to be in contact with the top surface of the connection pad.

Further, an end of the elastic unit is bent toward the extension unit upward.

Further, the connector includes a fixing member for fixing the housing and the printed circuit board by being provided outside the housing and the printed circuit board.

Further, the fixing member is formed of elastic material.

In accordance with another aspect of the present invention to achieve the object, there is provided a connector including: a printed circuit board including two guide holes spaced apart from each other and a locking hole positioned between the guide holes; a plurality of connection pads provided on a top surface of the printed circuit board; a housing including a space unit at a lower part, into which a portion of the printed circuit board between the two guide holes is inserted; a plurality of terminals inserted and fixed into the housing so that one ends are positioned inside the housing and the other ends are projected to an outside of the housing; and terminal units in contact with top surfaces of the connection pads by being connected to the one ends of the terminals inside the housing.

Herein, a locking unit inserted into the locking hole is protrudingly formed on a central top surface of the space unit.

Further, the locking unit is formed of elastic material.

In accordance with still another aspect of the present invention to achieve the object, there is provided a connector including: a printed circuit board including a plurality of locking holes; a plurality of connection pads provided on a top surface of the printed circuit board; a housing which is mounted on the printed circuit board and includes protruding locking units inserted into the locking holes on a bottom surface; a plurality of terminals inserted and fixed into the housing so that one ends are positioned inside the housing and the other ends are projected to an outside of the housing; and terminal units in contact with top surfaces of the connection pads by being connected to the one ends of the terminals inside the housing.

Herein, the locking units are formed in a snap-fit shape.

Further, the locking holes are formed in a circular shape.

Further, the locking holes are formed in a linear shape.

Further, the locking holes are not formed in the same direction.

Further, the locking holes are formed in parallel.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is an exploded perspective view illustrating a structure of a connector in accordance with a first embodiment of the present invention;

FIG. 2 is an assembly cross-sectional view of FIG. 1;

FIG. 3 is a side cross-sectional view of FIG. 1;

FIG. 4 is a view illustrating the connector shown in FIG. 2 on which a fixing member is coupled;

FIG. 5 is a side cross-sectional view of FIG. 4;

FIG. 6 is an exploded perspective view illustrating another structure of the connector in accordance with the first embodiment of the present invention;

FIG. 7 is an assembly cross-sectional view of FIG. 6;

FIG. 8 is an exploded perspective view illustrating still another structure of the connector in accordance with the first embodiment of the present invention;

FIG. 9 is an assembly cross-sectional view of FIG. 8;

FIG. 10 is an exploded perspective view illustrating a structure of a connector in accordance with a second embodiment of the present invention;

FIG. 11 is an assembly cross-sectional view of FIG. 10;

FIG. 12 is an exploded perspective view illustrating another structure of the connector in accordance with the second embodiment of the present invention;

FIG. 13 is an assembly cross-sectional view of FIG. 12;

FIG. 14 is an exploded perspective view illustrating still another structure of the connector in accordance with the second embodiment of the present invention; and FIG. 15 is an assembly cross-sectional view of FIG. 14.

DETAILED DESCRIPTION OF THE PREFERABLE EMBODIMENTS

The present invention may include several embodiments through various modifications, wherein specific embodiments are exemplified in the accompanying drawings and will be explained in detail, hereinafter. However, it should be understood that the present invention is not limited to the specific embodiments and includes all modifications, equivalents and substitutions falling within the spirit and technical scope of the present invention. In description of the present invention, if it is determined that detailed description of related published techniques makes the gist of the present invention vague, the detailed description thereof will be omitted.

Although terms such as "first" and "second" may be used in order to describe various components, the components should not be limited by the terms. The terms are used only to distinguish one component from the other components.

The terms of this application are used only to describe the specific embodiments, but are not to be construed to limit the present invention. A singular form includes a plural form as long as the singular form does not clearly indicate a different thing from the plural form. It should be understood that in this application, terms such as "include" or "have" specify existence of a characteristic, a figure, a step, an operation, a component, a part or a combination thereof which are described in the specification but do not previously exclude existence or possibility of addition of one or more different characteristics, figures, steps, operations, components, parts or combinations thereof.

Hereinafter, embodiments of a connector in accordance with the present invention will be described in detail with reference to the accompanying drawings. In describing them with reference to the accompanying drawings, the same or corresponding component will be represented by the same reference numeral and repeated description thereof will be omitted.

Hereinafter, the connector in accordance with a first embodiment of the present invention is described with reference to FIGS. 1 to 9.

FIG. 1 is an exploded perspective view illustrating a structure of a connector in accordance with a first embodiment of the present invention, FIG. 2 is an assembly cross-sectional view of FIG. 1, FIG. 3 is a side cross-sectional view of FIG. 1, FIG. 4 is a view illustrating the connector shown in FIG. 2 on which a fixing member is coupled, FIG. 5 is a side cross-sectional view of FIG. 4, FIG. 6 is an exploded perspective view illustrating another structure of the connector in accordance with the first embodiment of the present invention, FIG. 7 is an assembly cross-sectional view of FIG. 6, FIG. 8 is an exploded perspective view illustrating still another structure of the connector in accordance with the first embodiment of the present invention, and FIG. 9 is an assembly cross-sectional view of FIG. 8.

First, as shown in FIGS. 1 to 3, the connector in accordance with the first embodiment of the present invention includes a printed circuit board 100 and a housing 200 coupled and fixed on the printed circuit board 100.

A plurality of terminals 230 are inserted and fixed at one side of the housing 200. The housing 200 is generally made of synthetic resin that is an insulator, or the like and the terminals 230 are made of metal with high electrical conductivity, or the like.

One ends of the terminals 230 are positioned inside the housing 200 and the other ends thereof project to an outside of the housing 200.

And, terminal units 240 are coupled with the one ends of the terminals 230 which are positioned inside the housing 200.

The terminal unit 240, as shown in FIG. 3, includes an extension unit **240*a* extended to an inside of the housing 200 by being coupled with the terminal 230, and an elastic unit 240*b* having elastic force by being extended from the extension unit 240*a* and bent toward the terminal 230** downward.

Herein, a plurality of connection pads 130 are formed at portions corresponding to the terminal units 240 on a top surface of the printed circuit board 100 which is coupled under the housing 200 and top surfaces of the connection pads 130 are in contact with the elastic units **240*b* of the terminal units 240**.

At this time, ends **240*c* of the elastic units 240*b* are bent toward the extension units 240*a* of the terminal units 240 upward. This is to increase elasticity of the terminal units 240 and prevent damage of the surface of the printed circuit board 100 due to the sharp ends 240*c* of the elastic units 240*b* when the printed circuit board 100 is mounted under the housing 200**.

A guide hole 110 is formed among the connection pads 130 of the printed circuit board 100, which is extended from an edge to the inside of the printed circuit board 100. It is preferable that the guide hole 110 is formed in a linear shape.

A locking hole 120 is formed at a portion adjacent to the guide hole 110. The locking hole 120 may be spaced apart from the guide hole 110.

And, on a bottom surface of the housing 200, a guide 210 is provided, which is inserted into the guide hole 110 by being protrudingly formed at a portion corresponding to the guide hole 110 of the printed circuit board 100, and a locking unit 220 is provided, which is inserted into the locking hole 120 by being protrudingly formed at a portion corresponding to the locking hole 120 of the printed circuit board 100.

The guide 210 of the housing 200 is slidingly inserted into the guide hole 110 of the printed circuit board 100.

Herein, the guide 210 includes an insertion unit **210*a* inserted into the guide hole 110 and a fixing unit 210*b* which is not inserted into the guide hole 110 by being extended at a lower part of the insertion unit 210*a* to have a larger width than the insertion unit 210*a***.

Since the fixing unit 210*b* is formed to have the larger width than the guide hole 110, it is possible to prevent the housing 200 from moving upward after the housing 200 is coupled on the printed circuit board 100.

Further, since the locking unit 220 corresponding to the locking hole 120 of the printed circuit board 100 is formed of elastic material, while the guide 210 is inserted into the printed circuit board 100, it is positioned on a top surface of the printed circuit board 100 and when the guide 210 is completely inserted into the guide hole 110, it is inserted into the locking hole 120, so that the housing 200 can be fixed to the printed circuit board 100.

As mentioned above, after the housing 200 is coupled and fixed to the printed circuit board 100, the elastic units 240*b* of the terminal units 240 provided inside the housing 200 become in contact with the connection pads 130 provided on the top surface of the printed circuit board 100, whereby the connection pads 130 and the terminals 230 are electrically connected to each other.

Herein, as shown in FIGS. 4 and 5, since a fixing member 300 is further provided outside the housing 200 and the printed circuit board 100, edges of the housing 200 and the printed circuit board 100 are closely adhered to thereby firmly fix the housing 200 and the printed circuit board 100.

The fixing member 300 may be formed of elastic material or the like by which coupling portions of the housing 200 and the printed circuit board 100 are elastically pressed.

Meanwhile, although one guide hole 110 is formed on the printed circuit board 100 as shown in the drawings, it is exemplified by, but not limited to this.

For example, as shown in FIGS. 6 and 7, two guide holes 110 may be formed on the printed circuit board 100. In the case where the two guide holes 110 are formed, it is preferable that two guides 210 of the housing 200 corresponding to the guide holes 110 are formed.

At this time, although one locking hole 120 is formed between the two guide holes 110 as shown in FIG. 6, it is exemplified by this, but the number and position of the locking hole 120 are not limited to this.

Further, as shown in FIGS. 8 and 9, in the case where the two guide holes 110 are spaced apart from each other, at a lower part of the housing 200, instead of the protruding guides 210, a space unit 250 may be formed, into which a portion of the printed circuit board 100 between the two guide holes 110 is inserted.

At this time, a locking hole 120 may be formed on the printed circuit board between the two guide holes 110 which are spaced apart from each other.

And, a locking unit 220 may be formed on a central top surface of the space unit 250 at a position corresponding to the locking hole 120. It is preferable that the locking unit 220 is formed of elastic material as described above.

While the housing 200 including the space unit 250 is inserted into the printed circuit board 100, the locking unit 220 provided on the space unit 250 is positioned on a top surface of the printed circuit board 100 and when the printed circuit board 100 is completely inserted into the space unit 250 of the housing 200, it is inserted into the locking hole 120, whereby the housing 200 can be fixed to the printed circuit board 100.

Hereinafter, a connector in accordance with a second embodiment of the present invention is described with reference to FIGS. 10 to 15.

FIG. 10 is an exploded perspective view illustrating a structure of a connector in accordance with a second embodiment of the present invention, FIG. 11 is an assembly cross-sectional view of FIG. 10, FIG. 12 is an exploded perspective view illustrating another structure of the connector in accordance with the second embodiment of the present invention, FIG. 13 is an assembly cross-sectional view of FIG. 12, FIG. 14 is an exploded perspective view illustrating still another structure of the connector in accordance with the second embodiment of the present invention, and FIG. 15 is an assembly cross-sectional view of FIG. 14.

First, as illustrated in FIGS. 10 and 11, the connector in accordance with the second embodiment of the present invention includes most of the same components as those of the connector in accordance with the first embodiment of the present invention, but it is different from the connector of the first embodiment in that on a printed circuit board 100, the guide hole 110 is not formed and a plurality of locking holes 111 are formed, and on a bottom surface of a housing 200, a plurality of locking units 211 are provided, which are inserted into the locking holes 111 by being protrudingly formed at portions corresponding to the locking holes 111 of the printed circuit board 100.

The locking units 211 are preferably formed in a snap-fit shape and the snap-fit shaped locking units 211 are inserted into the locking holes 111 to thereby fix the housing 200 to the printed circuit board 100.

Although the snap-fit shaped locking units 211 are formed in a triangular shape, they may be formed in various shapes as long as they have a function of fixing the housing 200 to the printed circuit board 100.

Although the locking holes 111, where the locking units 211 are inserted, may be formed in a circular shape as shown in FIG. 10, they are exemplified by, but not limited to this.

For instance, as shown in FIGS. 12 and 13, locking holes 112 are formed in a linear shape, not the circular shape. In this case, locking units 212 are inserted into the locking holes 112 by being protrudingly formed on a bottom surface of a housing 200, wherein it is preferable that the locking units 212 are inserted into the locking holes 112 by being formed to have the same sizes as those of the locking holes 112.

At this time, although the locking holes 112 having the linear shape may not be formed in the same direction as shown in FIG. 12, they may be formed in parallel as shown in FIGS. 14 and 15.

As described above, the connector can reduce the number of parts to reduce a manufacture cost without a wafer which was mounted between a housing 200 and a printed circuit board 100 by forming both the guide hole 110 and the locking hole 120 for mechanical coupling with the housing 200 or only the locking holes 111 and 112 on the printed circuit board 100 and forming the connection pads 130 in contact with the terminal units 240 connected to the terminals 230 of the housing 200 on the top surface of the printed circuit board 100.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:

1. A connector comprising:

a printed circuit board including a guide hole and a locking hole;

a plurality of connection pads provided on a top surface of the printed circuit board;

a housing which is mounted on the printed circuit board and includes a guide inserted into the guide hole and a locking unit inserted into the locking hole, which are protrudingly formed on a bottom surface of the housing;

a plurality of terminals inserted and fixed into the housing, each of the plurality of terminals having one end positioned inside the housing and the other end projecting to an outside of the housing; and terminal units in contact with top surfaces of the connection pads by being connected to the one ends of the terminals inside the housing, wherein each of the terminal units includes an extension unit extending into the housing by being coupled to each of the plurality of terminals and an elastic unit extending from the extension unit and being bent toward each of the plurality of terminals downwardly with an elastic force to be in contact with the top surface of the connection pad.

2. The connector of claim 1, wherein the guide hole is extended from an edge to an inside of the printed circuit board.

3. The connector of claim 2, wherein the guide hole is formed in a linear shape.

4. The connector of claim 1, wherein the locking hole is spaced apart from the guide hole.

5. The connector of claim 1, wherein the guide includes an insertion unit inserted into the guide hole and a fixing unit not inserted into the guide hole by being extended at a lower part of the insertion unit to include a larger width than the insertion unit.

6. The connector of claim 1, wherein the locking unit is formed of elastic material.

7. The connector of claim 1, wherein each of the terminal units includes an extension unit extended into the housing by being coupled with the terminal and an elastic unit which is extended from the extension unit and bent toward the terminal downward with elastic force to be in contact with the top surface of the connection pad.

8. The connector of claim 7, wherein an end of the elastic unit is bent toward the extension unit upward.

9. The connector of claim 1, further comprising:

a fixing member for fixing the housing and the printed circuit board by being provided outside the housing and the printed circuit board.

10. The connector of claim 9, wherein the fixing member is formed of elastic material.

11. A connector comprising:

a printed circuit board including two guide holes spaced apart from each other and a locking hole positioned between the guide holes;

a plurality of connection pads provided on a top surface of the printed circuit board;

a housing including a space unit at a lower part, into which a portion of the printed circuit board between the two guide holes is inserted;

a plurality of terminals inserted and fixed into the housing, each of the plurality of terminals having one end positioned inside the housing and the other end projecting to an outside of the housing; and terminal units in contact with top surfaces of the connection pads by being connected to the one ends of the terminals inside the housing, wherein each of the terminal units includes an extension unit extending into the housing by being coupled to each of the plurality of terminals and an elastic unit extending from the extension unit and being bent toward each of the plurality of terminals downwardly with an elastic force to be in contact with the top surface of the connection pad.

12. The connector of claim 11, wherein a locking unit inserted into the locking hole is protrudingly formed on a central top surface of the space unit.

13. The connector of claim 12, wherein the locking unit is formed of elastic material.

14. A connector comprising:

a printed circuit board including a plurality of locking holes;

a plurality of connection pads provided on a top surface of the printed circuit board;

a housing which is mounted on the printed circuit board and includes protruding locking units inserted into the locking holes on a bottom surface;

a plurality of terminals inserted and fixed into the housing, each of the plurality of terminals having one end positioned inside the housing and the other end projecting to an outside of the housing; and terminal units in contact with top surfaces of the connection pads by being connected to the one ends of the terminals inside the housing, wherein each of the terminal units includes an extension unit extending into the housing by being coupled to each of the plurality of terminals and an elastic unit extending from the extension unit and being bent toward each of the plurality of terminals downwardly with an elastic force to be in contact with the top surface of the connection pad.

15. The connector of claim 14, wherein the locking units are formed in a snap-fit shape.

16. The connector of claim 14, wherein the locking holes are formed in a circular shape.

17. The connector of claim 14, wherein the locking holes are formed in a linear shape.

18. The connector of claim 17, wherein all of the locking holes are not formed in the same direction.

19. The connector of claim 17, wherein all of the locking holes are formed in parallel.

* * * * *